US006867717B1

(12) United States Patent
Ion et al.

(10) Patent No.: US 6,867,717 B1
(45) Date of Patent: Mar. 15, 2005

(54) DIGITAL ENCODER AND METHOD OF ENCODING HIGH DYNAMIC RANGE VIDEO IMAGES

(75) Inventors: Lucian Ion, Waterloo (CA); Felicia Shu, Waterloo (CA); Charles Smith, Waterloo (CA); Harald Siefken, Kitchener (CA)

(73) Assignee: DALSA, Inc., Waterloo (CA)

( * ) Notice: Subject to any disclaimer, the term of this patent is extended or adjusted under 35 U.S.C. 154(b) by 0 days.

(21) Appl. No.: 10/406,258

(22) Filed: Apr. 4, 2003

Related U.S. Application Data
(60) Provisional application No. 60/369,606, filed on Apr. 4, 2002.

(51) Int. Cl.⁷ .................................. H03M 1/06
(52) U.S. Cl. .................... 341/118; 341/139; 341/155
(58) Field of Search ................ 341/118, 120, 341/139, 155; 348/572, 678

(56) References Cited

U.S. PATENT DOCUMENTS

| 4,525,741 A | * | 6/1985 | Chahal et al. ............... 348/255 |
| 4,999,628 A | | 3/1991 | Kakubo et al. |
| 5,111,202 A | | 5/1992 | Rivera et al. |
| 5,231,398 A | | 7/1993 | Topper |
| 5,250,948 A | | 10/1993 | Berstein et al. |
| 5,335,013 A | | 8/1994 | Faber |
| 5,446,371 A | | 8/1995 | Eccleston et al. |
| 5,475,425 A | | 12/1995 | Przyborski et al. |
| 5,565,916 A | * | 10/1996 | Katayama et al. .......... 348/321 |
| 5,592,237 A | | 1/1997 | Greenway et al. |
| 5,596,427 A | | 1/1997 | Honma et al. |
| 5,691,821 A | | 11/1997 | Hieda et al. |
| 5,805,150 A | * | 9/1998 | Nishino et al. ............. 345/213 |
| 5,831,673 A | | 11/1998 | Przyborski et al. |
| 6,005,614 A | | 12/1999 | Katayama |
| 6,342,850 B1 | | 1/2002 | Borer et al. |
| 6,683,552 B2 | * | 1/2004 | Noll et al. ................... 341/155 |

FOREIGN PATENT DOCUMENTS

| WO | WO 93/14591 | 7/1993 |
| WO | WO 95/20292 | 7/1995 |
| WO | WO 01/68326 | 9/2001 |

* cited by examiner

*Primary Examiner*—Michael Tokar
*Assistant Examiner*—Khai Nguyen
(74) *Attorney, Agent, or Firm*—Millen, White, Zelano & Branigan, P.C.

(57) ABSTRACT

An encoder includes a linear offset amplifier, a linear analog to digital converter coupled to the linear offset amplifier, a switched offset amplifier, a switched analog to digital converter coupled to the switched offset amplifier, and a video controller. The video controller is coupled to both the linear and switched analog to digital converters. The video controller is configured to set both gains and offsets of the linear and switched analog to digital converters so that the gain and offset of the linear analog to digital converter is different than the gain and offset of the switched analog to digital converter.

26 Claims, 4 Drawing Sheets

DIGITAL ENCODER AND METHOD OF ENCODING HIGH DYNAMIC RANGE VIDEO IMAGES

BACKGROUND OF THE INVENTION

The priority benefit of the Apr. 4, 2002 filing date of provisional application 60/369,606 is hereby claimed.

1. Field of the Invention

The present invention relates to digital encoder for video images. In particular, the invention relates to a digital encoder that emulates the non-linear characteristics of film.

2. Description of Related Art

One of the defining characteristics of film is that it has a photonic response characteristic that is "S"shaped, known as the "D-logE" curve, which is a log plot of the density of the exposed film vs. the exposure required to achieve that density. This curve is analogous to the responsivity characteristic of a silicon image sensor which plots the level of exposure to light required to achieve a given output voltage. See FIG. 3. The primary difference between film and video is that conventional video encoding has implemented a relatively sharp knee, or "hard" saturation which means that image detail in highly exposed areas is lost whereas the "soft" characteristics of film provide image detail in these highlight areas. Similarly, in low light areas, silicon sensors provide a linear response down to practically zero output voltage where again film provides a soft "toe" thereby preserving "shadow detail".

FIG. 3 is a graph of a representative photonic response of film and a silicon based sensor. Cinematographers use this characteristic of the film (each film stock is different) to achieve certain desired artistic effects and those that have experimented with digital HDTV cameras have consistently noted this particular shortcoming of digital systems.

SUMMARY OF THE INVENTION

It is an object to the present invention to provide a digital emulation of film dynamic range or exposure latitude performance.

This and other objects are achieved, for example, in an encoder that includes a linear offset amplifier, a linear analog to digital converter coupled to the linear offset amplifier, a switched offset amplifier, a switched analog to digital converter coupled to the switched offset amplifier, and a video controller. The video controller is coupled to both the linear and switched analog to digital converters. The video controller is configured to set both gains and offsets of the linear and switched analog to digital converters so that the gain and offset of the linear analog to digital converter is different than the gain and offset of the switched analog to digital converter.

This and other objects are also achieved, for example, in an encoder that includes a linear 14-bit analog to digital converter, a switched 14-bit analog to digital converter, and a video controller coupled to both the linear and switched analog to digital converters to provide an output from the switched analog to digital converter when a video signal is less than a first predetermined threshold. The video controller is configured to provide a 16 bit output composed from the output from the switched analog to digital converter.

This and other objects are also achieved, for example, in an encoder that includes a linear analog to digital converter, a switched analog to digital converter, a video controller coupled to both the linear and switched analog to digital converters, a first offset mechanism, coupled to the linear analog to digital converter, and a second offset mechanism, coupled to the switched analog to digital converter. The video controller is configured to control the first offset mechanism to adjust an offset of the linear analog to digital converter. The video controller is also configured to control the second offset mechanism to adjust an offset of the switched analog to digital converter and the second offset mechanism is independent of the first offset mechanism.

This and other objects are also achieved, for example, in an encoder that includes a linear analog to digital converter and a switched analog to digital converter. The linear analog to digital converter produces a linear analog to digital converter output when a video signal is greater than a first predetermined threshold. The switched analog to digital converter produces a switched analog to digital converter output when a video signal is less than the first predetermined threshold and there is a transition between the switched analog to digital converter output and the linear analog to digital converter output as the video signal changes from less than the first predetermined threshold to greater than the first predetermined threshold. The encoder further includes means for smoothing the transition between the switched analog to digital converter output and the linear analog to digital converter output.

This and other objects are also achieved, for example, in an encoder that includes a linear analog to digital converter, a switched analog to digital converter, and means for digital filtering the linear analog to digital converter output and the switched analog to digital converter output. The linear analog to digital converter produces a linear analog to digital converter output when a video signal is greater than a first predetermined threshold and the switched analog to digital converter produces a switched analog to digital converter output when a video signal is less than the first predetermined threshold. The means for digital filtering digitally filters the linear analog to digital converter output differently than the switched analog to digital converter output.

This and other objects are also achieved, for example, in a method that includes steps of adjusting an offset of both a switched analog to digital converter and a linear analog to digital converter in response to actuation of a set signal and smoothing a combination of an output of the switched analog to digital converter and an output of the linear analog to digital converter within an overlap region about a threshold.

This and other objects are also achieved, for example, in a method of digitizing an analog signal that includes steps of capturing an analog input signal in a non-linear toe region with an output of a switched analog to digital converter, capturing the analog input signal in a linear region with an output of a linear analog to digital converter, and capturing the analog input signal in a non-linear shoulder region with the output of the switched analog to digital converter.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

In industrial and computer imaging, one of the important performance criteria of an imaging system is the linearity of its transfer function, or response to varying light levels. However, there are a few characteristics of human vision that do not follow the same rules as machine vision. Essentially, the ability of human vision to detect intensity difference, or luminance, is not uniform over the range from black to white. The intensity discrimination of the human visual system is a nonlinear power function that decreases from black to white. It is considered that after adapting to surrounding illumination levels human vision can distinguish between different luminance levels down to about 1% of the scene's "peak white" value. At the same time, human vision adapts over an extremely wide range of viewing conditions thus making it a complex system to emulate. The following quote from "A Technical Guide to Digital Video" by Charles Poyton illustrates this point:

> Image coding for the reproduction of pictures for human viewers is not simply concerned with mathematics, physics, chemistry and electronics. Perceptual considerations play an essential role in successful image systems.

Film has an inherently non-linear response to illumination levels that is similar to human visual perception. There are two regions on the film transfer curve, represented in FIG. 1, that result in a better preservation of perceptual details in the scene. The "toe" region resembles human vision in dark areas and the "shoulder" region expands the maximum perceivable detail by compressing scene highlights.

In digital imaging, one of the most noticeable negative effects of a linear transfer function is banding in the dark shadow areas if not enough digital levels are used to digitize the luminance information. Linear digitization to a minimum of 16 bits (64,000 levels) would be required to eliminate this effect but currently available 16 bit analog to digital converters (ADC) are at least on order of magnitude too slow in operating speed. The other area where digital video has failed to produce film-like quality is in the reproduction of highlight details which again would require a 16 bit ADC.

Figure 1:
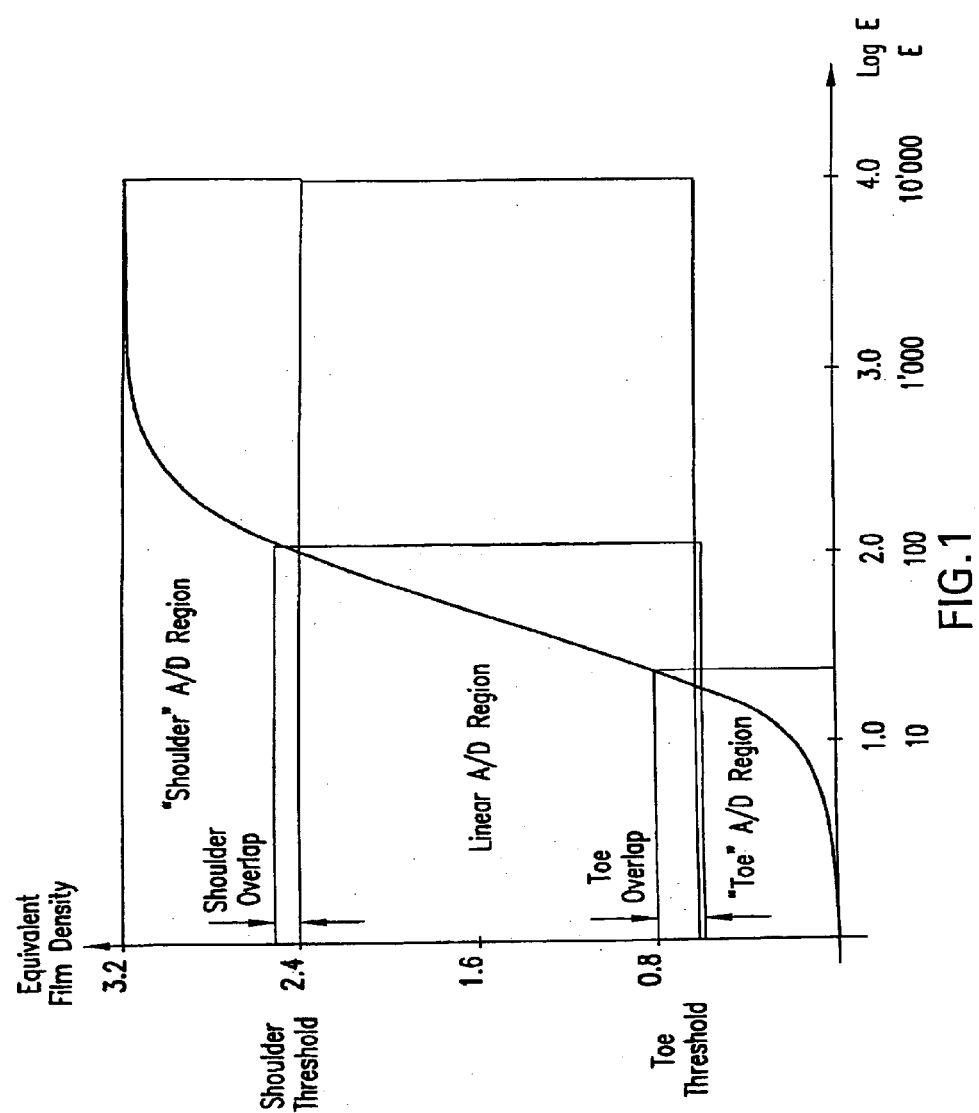
FIG. 1 is a graph of a photonic response according to the invention.

As an alternative, a digital encoding method of the present invention offers a more efficient use of available "digital codes" to expand the dynamic range of an image over more than five orders of magnitude. FIG. 1 segregates the response curve into 3 portions called "Shoulder", "Linear" and "Toe" A/D Regions, respectively. Through the use of two 14 bit ADC's and local filtering, one ADC is assigned to digitize the basic linear region of the luminance information (linear ADC) and the second alternates between digitizing the shadow detail ("Toe") and the highlight detail (Shoulder") depending on the base scene illumination (switched ADC). This architecture enables the dynamic range in the toe region to be set using an adjustable factor to provide increased shadow detail. The initial target value used will provide 4×more detail in the toe region as compared to using a single linear 14 bit ADC to cover the entire luminance range.

In the shoulder region, the inherent non-linearity of the image sensor when approaching saturation coupled with the switched ADC and unique low pass local filtering is used to increase the dynamic range of the scene highlights by an additional 2–4 times.

Figure 2:
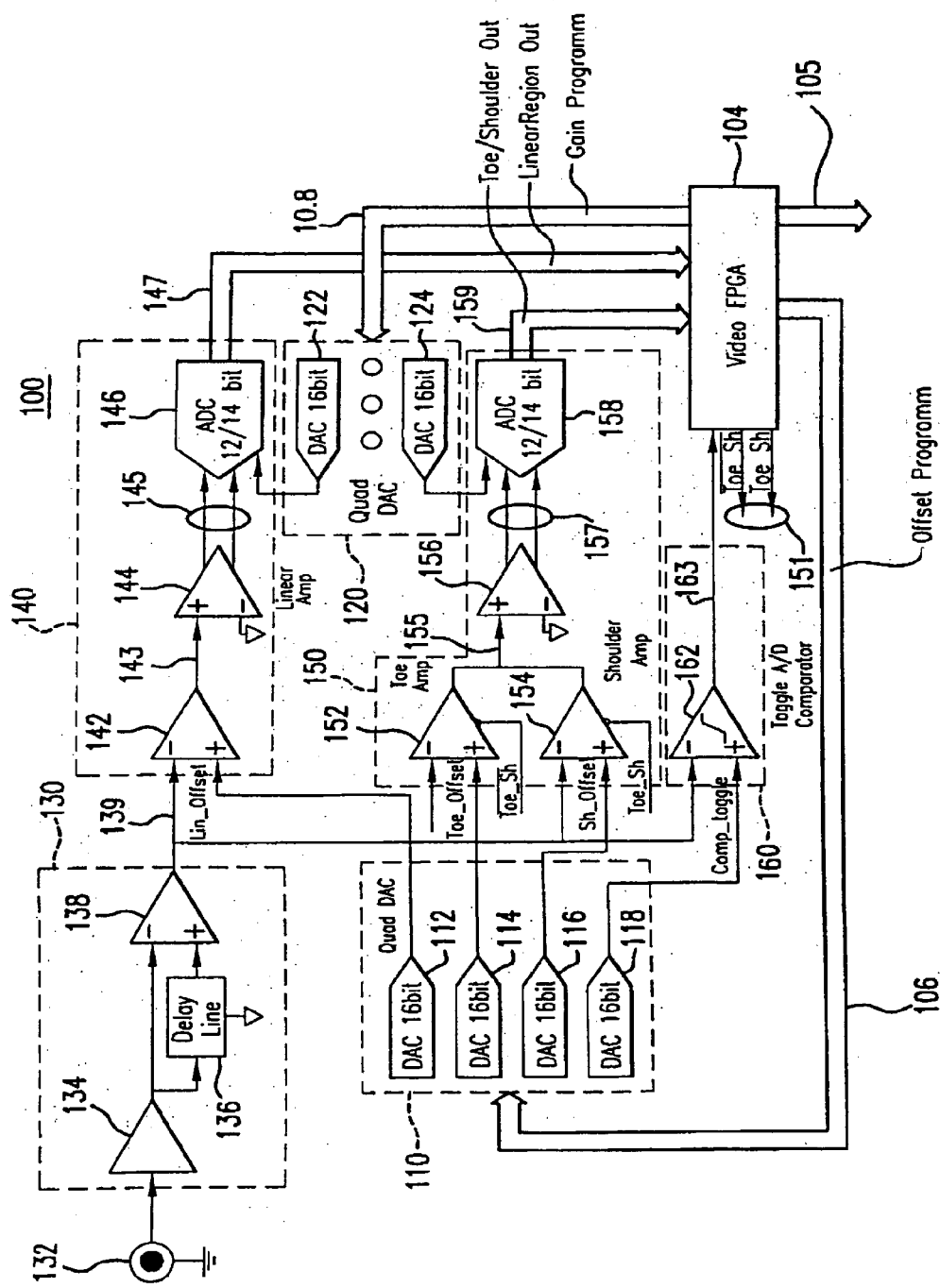
FIG. 2 is a block diagram of a digital encoder according to the invention.
Figure 3:
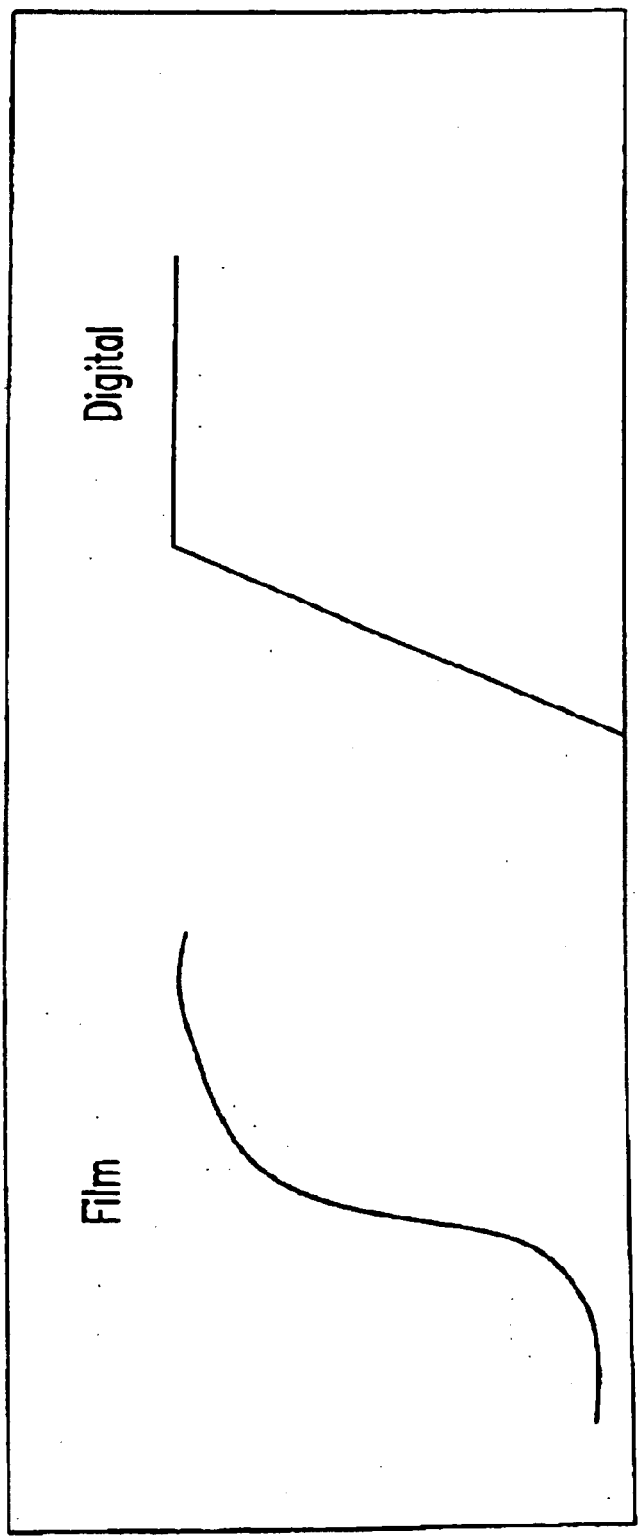
FIG. 3 is graph showing a comparison of the photonic response of film and a digital sensor.

In an implementation of the solution shown in FIG. 2, two 14 bit high speed ADCs 146 and 158 are used as described. The switched ADC 158 is toggled with a one pixel lag between scanning the "toe" detail and scanning highlights in the "shoulder" detail. A comparator 162 with hysteresis and a digital decision block are used to insure proper toggling between levels at preset thresholds corresponding to given luminance levels at either end of the linear ADC region. Additionally, proprietary digital video processing algorithms are implemented that shape the transfer curve of the switched ADC 158 to match the characteristics of film transfer curves. A 16 bit word is then composed from the output of the two ADC's 146, 158 depending on the luminance levels in the scene. The 16 bit word is preferably output by video controller 104 through output 105.

Three cases are described below for illustrative purposes.

Low Luminance Scenes In low light scenes or areas where luminance values do not exceed a threshold set to define the lower end of the linear region, the bottom 14 bits of the 16 bit word are taken from the output from the switched ADC 158 and the top two bits are filled in as "0."

Mid Luminance Scenes In scenes or areas where the luminance values fall within the linear ADC region the top 14 of the 16 bits are taken from the linear ADC 146 and the bottom two bits are filled with random noise.

High Luminance Scenes In scenes or areas where the luminance values exceed the threshold set for the upper end of the linear ADC region, the switched ADC 158 provides the top 14 bits and random noise is injected for the bottom two bits.

It is also crucial to ensure that the transition points between either end of the linear ADC region and the switched ADC regions are not visually perceptible. For example, in digital cameras used in television studios, the slope of the ADC response curve is reduced to approximately 70% of the full output range of the image sensor to provide the same extended range in high illumination scenes and reduce the loss of highlight details. This results in an output response consisting of two linear regions with a defined crossover value. This "knee" or transition point results in visual artifacts that are objectionable to professional cinematographers.

The architecture described herein provides for smooth transitions, as shown in FIG. 1, via a two step "curve smoothing and matching" technique. First, the gain and offset of each of the linear ADC 146 and the switched ADC 158 are adjusted by an analog "calibration" signal to provide for an overlap region between the two output ranges. This adjustment is provided by simply loading preset values that have been determined during factory calibration trough imaging a specific set of targets. In correlation to camera response the cinematographer can finalize the lighting for the scene to insure preservation of details over the entire dynamic range of the scene. Alternatively the cinematographer can modify a setup to achieve a desired lighting effect. In the overlap region, the output responses of the two ADCs 146, 158 are matched and smoothed by proprietary algorithms and filters and processed by the DSP blocks in the Digital Processing Cell of the camera. The proportions of the 16 bit output word provided by each of the ADC's will be defined by this processing as discussed in more detail below.

In an alternative embodiment to simplify the data processing, only the appropriate DC offset for the toe Op Amp 152 is switched in and gain values are not changed between the toe and shoulder regions. This approach simplifies the video path routing as the shoulder Op Amp 154 path is not required.

In yet another embodiment, the output of the linear ADC 146 is extended to cover either the full range from 0 to full saturation or from the top of the toe region to full saturation, and the switched ADC 152 is only used for the shadow detail where human visual perception is most sensitive. This will reduce dynamic range by up to 6 dB for the portion of the transfer curve between the toe threshold and full saturation. Suitability of this embodiment may be determined by visual acceptability tests that are somewhat subjective.

Figure 4:
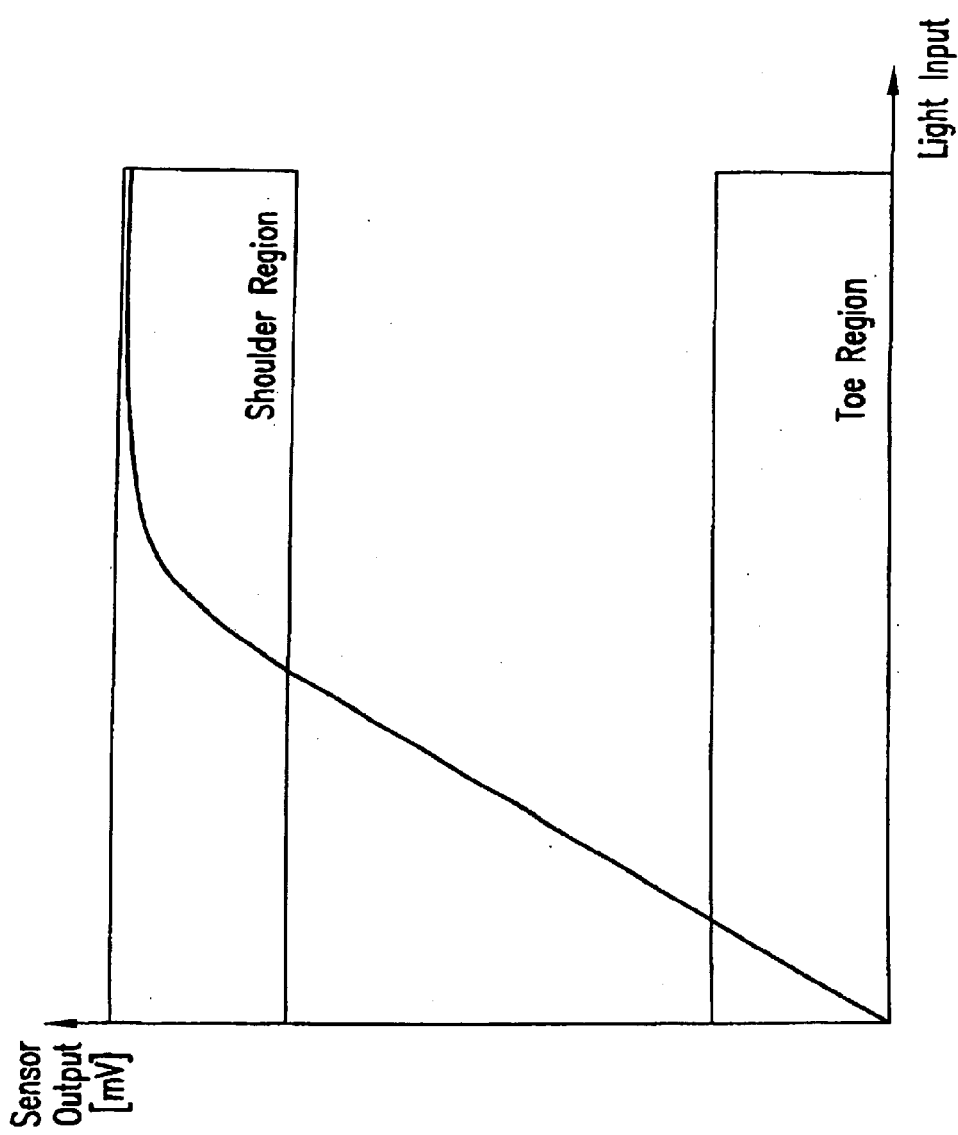
FIG. 4 is a graph of another photonic response according to the invention.

Theoretically, the final 16 bit word composed from the two ADC's 146, 152 could be preserved in linear form to provide the best digital representation of luminance details. FIG. 4 illustrates a transfer curve for transforming the scene light intensity into the final 16 bit word composed from the two ADC's 146, 152 in this embodiment. As shown, the switched ADC 158 provides an increased sampling accuracy of the analog input in the toe region. The roll-off in the shoulder region can be achieved by properly designing the sensor to have anti-blooming circuits in each pixel.

An alternative embodiment takes advantage of the perceptual attributes of human vision. This alternative embodiment compresses the final 16 bit word into a 12 bit or 10 bit log scale or power scale to provide for a more efficient computing architecture. FIG. 1 illustrates a transfer curve compressed according to this alternative embodiment. The light level information would be coded (e.g., for each primary color, RGB) to either a 12 bit log or a 12 bit encoded power law function with an exponent between 0.33 and 0.45. Other exponent values may be chosen. In this way, all three primary colors would be encoded into a 30 bit or 36 bit word.

Alternatively, because the human eye is less responsive to color detail than luminance detail, the three primary colors (e.g., RGB) could be transferred into a luminance (Y) and chrominance (U, V) format by use of a known transformation matrix to provide 16 bit values for each of the YUV signal components. Then, the luminance Y is compressed (e.g., log or power law function) into a 12 bit value and the chrominance UV is coded to two 10 bit (e.g., using log or power law functions) color indices (CIE u, v) thus keeping the total bits/pixel to 32 bits.

Depending on user preference an alternative embodiment would compress the 16 bit color channel value into 12 or 10 bit log scale or power scale for each of the RGB components resulting in a 36 or 30 bits/pixel.

The digital encoding method offers a more efficient use of available "digital codes" expanding the dynamic range of an image over more than five orders of magnitude and making the output response of the camera emulate the D-logE curve of film. Through the use of a second high resolution A/D converter and local filtering, the image dynamic range in the dark "toe" area can be increased with a scalable factor. In the highlight areas, the inherent non-linearity of the silicon image sensor together with a second A/D converter and local filtering can be used to increase the dynamic range by an additional 2–3 orders of magnitude.

Alternative implementations include:
1. The switched ADC 152 alternatively scans the toe or shoulder region of the luminance level with the overlap regions (where the output responses of the two ADCs are matched and smoothed by algorithms and filters) set by calibrating the output ranges of each ADC via adjustment of both gain and offset values for each ADC. This is the most complex embodiment.
2. The switched ADC 152 alternatively scans the toe or shoulder region of the luminance level with the overlap regions (where the output responses of the two ADCs are matched and smoothed by algorithms and filters) set by calibrating the output range of each ADC via adjustment of only the offset value for each ADC. This is the second most complex embodiment and assumes the same gain setting is acceptable for both the toe and shoulder regions.
3. Switched ADC 152 only scans the toe region while the linear ADC 146 scans the rest of the luminance levels leaving the saturation compression of a sensor due to high luminance regions to account for the soft knee shape of the film response. This is the least complex embodiment with technically lower performance but possibly still perceptually acceptable performance.

Conventional digital imaging systems are not able to provide high enough digital resolution in real time at the frame rates required by the application (i.e., high speed) to prevent visual artifacts known as "banding" in low light scenes or shadow areas of a scene. Additionally, the traditional saturation characteristics of digital imaging systems preclude capturing fine detail in bright scenes or areas of scenes resulting in a "washed out" look in these areas. The response characteristics of film inherently preserve detail in both dark and light scenes and this (among other attributes) has lead to the belief that film is inherently better than digital imaging thus preventing acceptance of digital camera in cinematography.

The present inventive ADC architecture provides a digital emulation of film dynamic range performance.

In FIG. 2, digital encoder 100 includes video controller 104 (e.g., field programmable gate array) that provides offset signals over offset signal bus 106 and gain signals over gain signal bus 108. Encoder 100 further includes offset control digital to analog converter (DAC) block 110 coupled to offset signal bus 106, and gain control digital to analog converter block 120 coupled to gain signal bus 108. Offset control digital to analog converter block 110 includes digital to analog converters 112, 114, 116 and 118, and gain control digital to analog converter block 120 includes digital to analog converters 122 and 124.

Digital encoder 100 further includes input connector or terminal 132 (receiving an input signal from the imaging sensor (not shown)), a correlated double sample circuit 130 and a linear processing circuit 140. The correlated double sample circuit 130 is constituted by initial amplifier 134, delay line 136 and differential amplifier 138 to provide video signal 139. The linear processing circuit 140 includes linear offset amplifier 142 to process video signal 139 into signal 143, linear amplifier 144 to process signal 143 into differential signal 145 and analog to digital converter 146 to convert differential signal 145 into linear region digitized signal provided to video controller 104 over linear region bus 147. Linear offset amplifier 142 provides signal 143 that is proportional to a difference between video signal 139 and a linear offset value from digital to analog converter 112. The conversion ratio (full range digital value divided by volts analog required to produce the full range digital value) of analog to digital converter 146 is controlled by a signal provided by digital to analog converter 122.

Digital encoder 100 further includes a shoulder and toe processing circuit 150 and a threshold circuit 160. The shoulder and toe processing circuit 150 includes toe offset amplifier 152 to process video signal 139 into signal 155, shoulder offset amplifier 154 to process video signal 139 into signal 155, amplifier 156 to process signal 155 into differential signal 157 and analog to digital converter 158 to convert differential signal 157 into toe region digitized signal provided to video controller 104 over toe/shoulder bus 159. Toe offset amplifier 152 provides signal 155 that is proportional to a difference between video signal 139 and a toe offset value from digital to analog converter 114. Shoulder offset amplifier 154 provides signal 155 that is proportional to a difference between video signal 139 and a shoulder offset value from digital to analog converter 116. Selection signals 151 are provided by video controller 104 to amplifiers 152 and 154 to select one of the amplifiers to provide their output as signal 155. This selection may be provided by either switching the output of the amplifiers on or off, or by powering the amplifier up or down. The conversion ratio (full range digital value divided by volts analog required to produce the full range digital value) of analog to digital converter 158 is controlled by a signal provided by digital to analog converter 124. The threshold circuit 160 includes comparator 162 providing toggle signal 163. Comparator 162 compares a difference between video signal 139 and a comparator toggle value from digital to analog converter 118.

In operation, the delayed double sample circuit 130 removes bias voltages or offsets that may exist in the signal provided by the imaging sensor, and then provides video signal 139 as an unbiased readout signal. Video signal 139 is provided to inputs of linear offset amplifier 142, toe offset amplifier 152, shoulder offset amplifier 154 and comparator 162. Comparator 162 informs video controller 104 whether the luminance is greater or less than the comparator threshold (defined by digital to analog converter 118), and video controller 104 responds by setting selection signals 151 to selected one of either toe offset amplifier 152 or shoulder offset amplifier 154 to provide signal 155 to differential amplifier 156. At the same time that either the shoulder or toe region digitized signal provided to video controller 104 over toe/shoulder bus 159, the linear region digitized signal is provided to video controller 104 over linear region bus 147.

Video controller 104 or subsequent processing provides a match and smooth function to blend or feather the transition from toe region to linear region or from linear region to shoulder regions. The following is just one example of this blending. A region of a predetermined extent is defined to be centered about a toe shape to linear shape threshold. Alternatively, the region of a predetermined extent may be defined to be bounded at either end by the toe shape to linear shape threshold. This exemplary region is partitioned into 8 sub-regions denoted A–H. The table below shows the proportion of linear digitized signal to be summed and the proportion of the toe digitized signal to be summed to produce a weighted average. It will be appreciated that many other techniques may be used to blend the linear and toe digitized signals in the region centered about a threshold. It will be further appreciated that the same blending approach may apply to the shoulder region.

| Sub-Region | Proportion of Toe Signal | Proportion of Linear Signal |
|---|---|---|
| A | 0.125 | 0.875 |
| B | 0.250 | 0.750 |
| C | 0.375 | 0.625 |
| D | 0.500 | 0.500 |
| E | 0.625 | 0.375 |
| F | 0.750 | 0.250 |
| G | 0.875 | 0.125 |
| H | 1.000 | 0.000 |

Having described preferred embodiments of a novel digital encoder for, and method of digital encoding of, images (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims. For example, differing weighting, blending and smoothing algorithms might be employed other than the one described with respect to the above table.

Having thus described the invention with the details and particularity required by the patent laws, what is claimed and desired protected by Letters Patent is set forth in the appended claims:

What is claimed is:

1. An encoder comprising:
   a linear offset amplifier;
   a linear analog to digital converter coupled to the linear offset amplifier;
   a switched offset amplifier;
   a switched analog to digital converter coupled to the switched offset amplifier; and
   a video controller coupled to both the linear and switched analog to digital converters, wherein the video controller is configured to set both gains and offsets of the linear and switched analog to digital converters so that the gain and offset of the linear analog to digital converter is different than the gain and offset of the switched analog to digital converter.

2. The encoder of claim 1, wherein:
   the video controller is coupled to both the linear and switched offset amplifiers.

3. The encoder of claim 1, further comprising an interpolator to smooth outputs from the linear and switched analog to digital converters.

4. The encoder of claim 1, wherein the video controller provides an output from the switched analog to digital converter when a video signal is less than a first predetermined threshold.

5. The encoder of claim 4, wherein the video controller provides an output from the linear analog to digital converter when the video signal is greater than the first predetermined threshold.

6. An encoder comprising:
   a linear analog to digital converter of at least a 14-bit length;
   a switched analog to digital converter of at least a 14-bit length; and
   a video controller coupled to both the linear and switched analog to digital converters to provide an output from the switched analog to digital converter when a video signal is less than a first predetermined threshold, wherein the video controller is configurable to provide at a first time an output composed from the output from the switched analog to digital converter and having at least a 16-bit length.

7. The encoder of claim 6 wherein the video controller provides an output from the linear analog to digital converter when the video signal is greater than the first predetermined threshold, wherein the video controller is configurable to provide at a second time an output composed from the output from the linear analog to digital converter and having at least a 16-bit length.

8. The encoder of claim 6 wherein:
   the video controller provides an output from the linear analog to digital converter when the video signal is greater than the first predetermined threshold and less than a second predetermined threshold; and
   the video controller provides an output from the switched analog to digital converter when the video signal is greater than a second predetermined threshold.

9. An encoder comprising:
   a linear analog to digital converter;
   a switched analog to digital converter;

a video controller coupled to both the linear and switched analog to digital converters;

a first offset mechanism coupled to the linear analog to digital converter, wherein the video controller is configured to control the first offset mechanism to adjust an offset of the linear analog to digital converter;

a second offset mechanism coupled to the switched analog to digital converter, wherein the video controller is configured to control the second offset mechanism to adjust an offset of the switched analog to digital converter and the second offset mechanism is independent of the first offset mechanism;

a first gain mechanism coupled to the linear analog to digital converter, wherein the video controller is configured to control the first gain mechanism to adjust a gain of the linear analog to digital converter; and a second gain mechanism coupled to the switched analog to digital converter, wherein the video controller is configured to control the second gain mechanism to adjust a gain of the switched analog to digital converter and the second gain mechanism is independent of the first gain mechanism.

10. An encoder comprising:

a linear analog to digital converter, wherein the linear analog to digital converter produces a linear analog to digital converter output when a video signal is greater than a first predetermined threshold;

a switched analog to digital converter, wherein the switched analog to digital converter produces a switched analog to digital converter output when a video signal is less than the first predetermined threshold and there is a transition between the switched analog to digital converter output and the linear analog to digital converter output as the video signal changes from less than the first predetermined threshold to greater than the first predetermined threshold; and means for smoothing the transition between the switched analog to digital converter output and the linear analog to digital converter output.

11. An encoder comprising:

a linear analog to digital converter, wherein the linear analog to digital converter produces a linear analog to digital converter output when a video signal is greater than a first predetermined threshold;

a switched analog to digital converter, wherein the switched analog to digital converter produces a switched analog to digital converter output when a video signal is less than the first predetermined threshold; and means for digital filtering the linear analog to digital converter output and the switched analog to digital converter output, wherein the means for digital filtering digitally filters the linear analog to digital converter output differently than the switched analog to digital converter output.

12. A method comprising steps of:

adjusting an offset of both a switched analog to digital converter and a linear analog to digital converter in response to actuation of a set signal; and smoothing a combination of an output of the switched analog to digital converter and an output of the linear analog to digital converter within an overlap region about a threshold.

13. The method of claim 12, wherein the adjusting the offset step adjusts the offset of the switched analog to digital converter independently of the offset of the linear analog to digital converter.

14. The method of claim 12, further comprising a step of adjusting a gain of both the switched analog to digital converter and the linear analog to digital converter.

15. The method of claim 14, wherein the adjusting the gain step adjusts the gain of the switched analog to digital converter independently of the gain of the linear analog to digital converter.

16. The method of claim 12, further comprising steps of:

digitally filtering the output of the switch analog to digital converter; and digitally filtering the output of the linear analog to digital converter, wherein the output of the linear analog to digital converter is digitally filtered differently than the output of the switch analog to digital converter.

17. The method of claim 12, further comprising a step of capturing a non-linear analog input signal in a shoulder region with the output of the switched analog to digital converter.

18. The method of claim 12, further comprising a step of increasing sampling accuracy of an analog input signal in a toe region with the switched analog to digital converter outputting a non-linear toe region signal by application of a power or log transfer function.

19. The method of claim 18, further comprising a step of adding additional bits to the output of the switched analog to digital converter where the output of the switched analog to digital converter captures the analog input signal.

20. A method of digitizing an analog signal comprising steps of:

capturing an analog input signal in a toe region with an output of a switched analog to digital converter;

capturing the analog input signal in a linear region with an output of a linear analog to digital converter; and capturing the analog input signal in a non-linear shoulder region with the output of the switched analog to digital converter.

21. The method of claim 20, wherein the output of the switched analog to digital converter overlaps the output of the linear analog to digital converter in a transition region, the method further comprising the step of smoothing the outputs of the switched analog to digital converter and the analog to digital converter in the transition region.

22. The method of claim 20, further comprising a step of adding additional bits to the output of the switched analog to digital converter where the output of the switched analog to digital converter captures the analog input signal.

23. The method of claim 20, wherein the capturing the analog input signal in a toe region step includes a step of the switched analog to digital converter producing an output when input signal is below a first threshold value.

24. The method of claim 23, wherein the capturing the analog input signal in a linear region step includes a step of the liner analog to digital converter producing an output when the input signal is greater than the first predetermined threshold.

25. The method of claim 23, wherein the capturing the analog input signal in a non-linear shoulder region step includes a step of the switched analog to digital converter producing an output when input signal is above a second threshold value.

26. The method of claim 20, further comprising a step of a programmable voltage reference external to the analog to digital converters fine tuning gains of the analog to digital converters.

* * * * *

UNITED STATES PATENT AND TRADEMARK OFFICE
CERTIFICATE OF CORRECTION

PATENT NO. : 6,867,717 B1
DATED : March 15, 2005
INVENTOR(S) : Lucian Ion et al.

It is certified that error appears in the above-identified patent and that said Letters Patent is hereby corrected as shown below:

Column 10,
Line 55, "liner" should read -- linear --.
Line 61, "when input" should read -- when the input --.

Signed and Sealed this

Fourteenth Day of June, 2005

JON W. DUDAS
*Director of the United States Patent and Trademark Office*